United States Patent
Tabery et al.

(10) Patent No.: US 6,905,971 B1
(45) Date of Patent: Jun. 14, 2005

(54) TREATMENT OF DIELECTRIC MATERIAL TO ENHANCE ETCH RATE

(75) Inventors: Cyrus Tabery, Sunnyvale, CA (US); Chih-Yuh Yang, San Jose, CA (US); William G. En, Milpitas, CA (US); Joong S. Jeon, Cupertino, CA (US); Minh Van Ngo, Fremont, CA (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 331 days.

(21) Appl. No.: 10/331,938

(22) Filed: Dec. 30, 2002

Related U.S. Application Data
(60) Provisional application No. 60/344,191, filed on Dec. 28, 2001.

(51) Int. Cl.[7] ................. H01L 21/302; H01L 21/461
(52) U.S. Cl. ................. 438/710; 438/689; 438/706
(58) Field of Search ................. 438/689, 706, 438/707, 710

(56) References Cited

U.S. PATENT DOCUMENTS

| | | | |
|---|---|---|---|
| 5,942,446 A * | 8/1999 | Chen et al. | 438/734 |
| 6,159,860 A | 12/2000 | Yang et al. | 438/706 |
| 6,217,084 B1 | 4/2001 | Larsson et al. | 285/305 |
| 6,225,659 B1 | 5/2001 | Liu | 257/314 |
| 6,258,675 B1 | 7/2001 | Gardner et al. | 438/287 |
| 6,285,054 B1 | 9/2001 | Liu et al. | 257/315 |
| 6,291,361 B1 * | 9/2001 | Hsia et al. | 438/738 |
| 6,297,107 B1 | 10/2001 | Paton et al. | 438/291 |
| 6,297,167 B1 | 10/2001 | Wang et al. | 438/714 |
| 6,303,418 B1 | 10/2001 | Cha et al. | 438/199 |
| 6,303,437 B1 | 10/2001 | Liu | 438/257 |
| 6,565,759 B1 * | 5/2003 | Chen et al. | 216/6 |

* cited by examiner

Primary Examiner—Michael S. Lebentritt
Assistant Examiner—Scott B. Geyer
(74) Attorney, Agent, or Firm—Renner, Otto, Boisselle, & Sklar, LLP

(57) ABSTRACT

In one embodiment, the present invention relates to a method for pre-treating and etching a dielectric layer in a semiconductor device comprising the steps of: (A) pre-treating one or more exposed portions of a dielectric layer with a plasma in a plasma etching tool to increase removal rate of the one or more exposed portions upon etching; and (B) removing the one or more exposed portions of the dielectric layer in the same plasma etching tool of step (A) via plasma etching.

20 Claims, 4 Drawing Sheets

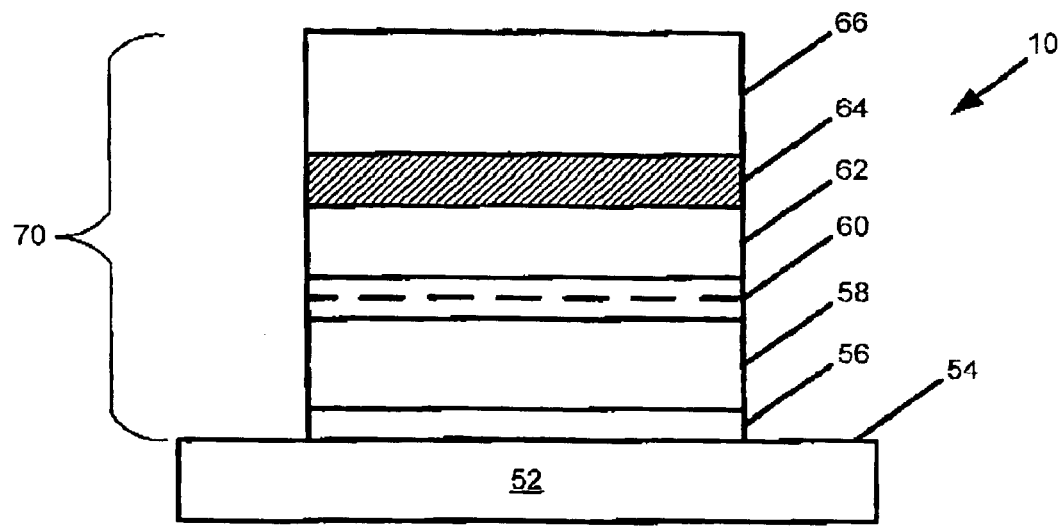
FIG. 2 - PRIOR ART
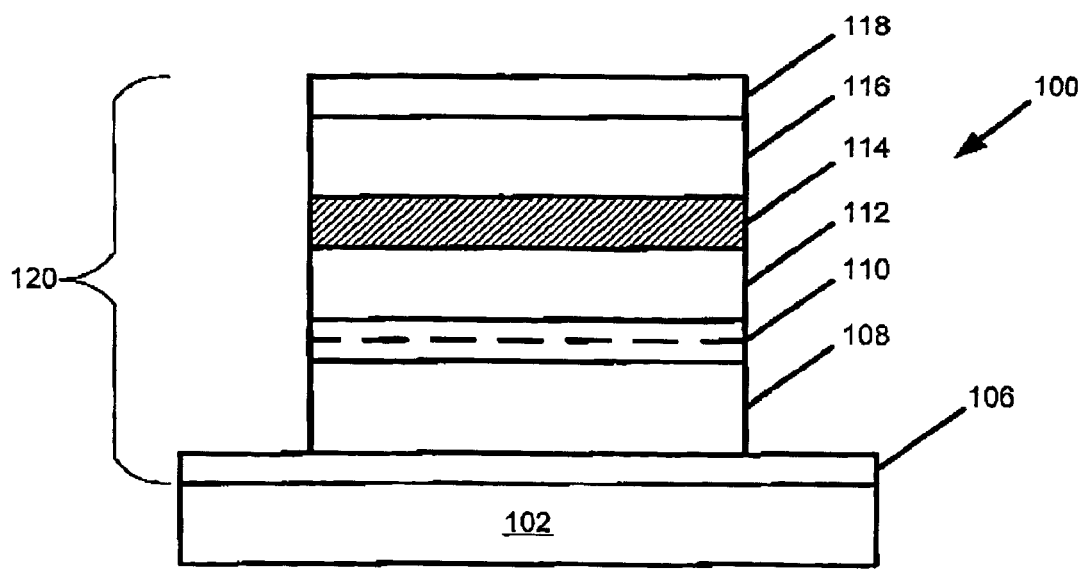
FIG. 4

US 6,905,971 B1

TREATMENT OF DIELECTRIC MATERIAL TO ENHANCE ETCH RATE

RELATED APPLICATION DATA

This application claims priority to previously filed U.S. Provisional Application No. 60/344,191, filed on Dec. 28, 2001, entitled "Treatment of Dielectric Material to Enhance Etch Rate", which is hereby incorporated herein by reference in its entirety.

FIELD OF THE INVENTION

The present invention relates to semiconductor devices and manufacturing processes, and more particularly to methods of integrating manufacturing steps in the production of semiconductor devices.

BACKGROUND OF THE INVENTION

A continuing trend in semiconductor technology is to build integrated circuits with more and/or faster semiconductor devices. The drive toward this ultra large-scale integration (ULSI) has resulted in continued shrinking of devices and circuit features. As the devices and features shrink, new problems are discovered that require new methods of fabrication and/or new arrangements.

FIG. 1 is a flow diagram illustrating a conventional process for etching a semiconductor wafer to form the memory gate stack 10 of FIG. 2. The memory gate 10 includes therein a suitable semiconductor substate 52 having a top surface 54 and a gate stack 70. The gate stack includes a tunnel oxide layer 56 (i.e., a standard-K dielectric layer) which separates a floating gate 58 firm the substrate 52. In some embodiments, it is both desirable and advantageous to form tunnel oxide layer 56 from a mid-K or high-K dielectric material.

An interpoly dielectric 60 separates the floating gate 58 from a control gate 62. The floating gate 58 and the control gate 62 are each electrically conductive and typically formed of polysilicon. On top of the control gate 62 is a silicide layer 64, which acts to increase the electrical conductivity of control gate 62. The silicide layer 64 is typically a tungsten silicide (e.g., $WSi_2$), that is formed on top of the control gate 62 prior to patterning, using conventional deposition and annealing processes.

The method shown in FIG. 1 begins in step 10, where the multi-layer semiconductor wafer including the polysilicon layer 58, the ONO layer 60, the polysilicon layer 62, the silicide layer 64, and an oxide cap layer 66 overlying the silicide layer is covered with a photoresist layer. It should be noted that the oxide cap layer 66 is optional and need not be included if so desired.

The photoresist layer is patterned in step 12 to form a mask to form the memory gate in step 12. The semiconductor wafer is then inserted into an oxide etch chamber in step 14, and an oxide etching operation is performed on the regions of the silicon oxynitride layer 66 exposed by the mask. The semiconductor wafer is then moved in step 16 from the oxide etch chamber to a polysilicon etch chamber, where polysilicon etch processing is performed on the silicide layer 64 and the polysilicon layer 62. The semiconductor wafer is then removed from the polysilicon etch chamber and cleaned in step 18 to remove any remaining resist, and polymers remaining during the etching process. For example, the resist and sidewalls of the etched semiconductor may be cleaned using a hydrofluoric acid dip, plus a dry plasma ($O_2$) clean, followed by a sulfuric acid bath.

Following cleaning, another mask is formed in step 20 to cover areas that are not part of a memory core. The masked wafer is then moved to an oxide etch chamber in step 22 for etching of the ONO layer 60. Once the ONO layer 60 is etched, the semiconductor wafer is once again moved in step 24 to a polysilicon etch chamber in step 24 for etching of the polysilicon layer 58, followed by cleaning of the mask in step 26. Finally, in step 28 the tunnel oxide layer 56 (i.e., dielectric layer 56) is etched back using the gate stack 70 as a mask. It will be apparent to one of skill in the art that additional processing steps can be conducted after step 28. However, for brevity, the discussion here of such further steps is omitted.

A problem arises when the tunnel layer 56 is formed from a high-K dielectric material in that the removal rate of most high-K dielectric materials is lower when compared with standard-K dielectric materials (oxides) from which tunnel oxide layer 56 is formed.

Conventional techniques for forming memory gates require a substantial amount of etching in different etching chambers. Such processes require significant amounts of handling of the semiconductor wafers, risking contamination of the wafer during transfers between etching chambers. Hence, there is a need in the art for a method to increase the etch rate of high-K dielectric materials without increasing the number of etching chambers utilized to etch a desired semiconductor device.

SUMMARY OF THE INVENTION

The present invention relates to a method for pre-treating and etching a dielectric layer in a semiconductor device comprising the steps of: (A) pre-treating one or more exposed portions of a dielectric layer with a plasma in a plasma etching tool to increase removal rate of the one or more exposed portions upon etching; and (B) removing the one or more exposed portions of the dielectric layer in the same plasma etching tool of step (A) via plasma etching.

In another embodiment, the present invention relates to a method for pre-treating and etching a dielectric layer in a semiconductor device comprising the steps of: (A) pre-treating one or more exposed portions of a high-K dielectric layer with a plasma generated by one or more gases selected from $O_2$, $N_2$, $N_2O$, NO, HBr, He, $F_2$, $SF_6$ plus $O_2$, $CH_3F$ plus $O_2$, or mixtures of two or more thereof, in a plasma etching tool to increase removal rate of the one or more exposed portions upon etching; and (B) removing the one or more exposed portions of the dielectric layer in the same plasma etching tool of step (A) via plasma etching with a plasma generated by one or more gases selected from HBr, $F_2$, $SF_6$ plus $O_2$, $N_2$, $CHF_3$ plus Ar, or mixtures of two or more thereof.

Thus, the present invention overcomes the problem of forming a memory gate via etching in any number of different etching chambers. The present invention also provides a benefit in that plasma pre-treating the dielectric material (especially a high-K dielectric material) increases the etch rate of the dielectric material.

BRIEF DESCRIPTION OF THE DRAWINGS

FIG. 2 is a schematic cross-sectional view of a portion of a semiconductor device having a patterned conventional layer stack thereon.

FIG. 4 is a schematic cross-sectional view of a exemplary semiconductor device (a memory gate) having a patterned stack layer that includes a polysilicon cap layer and a silicon oxynitride stop layer prior to pre-treatment and plasma etch of the dielectric layer according to one embodiment of the present invention.

DETAILED DESCRIPTION

Figure 1:
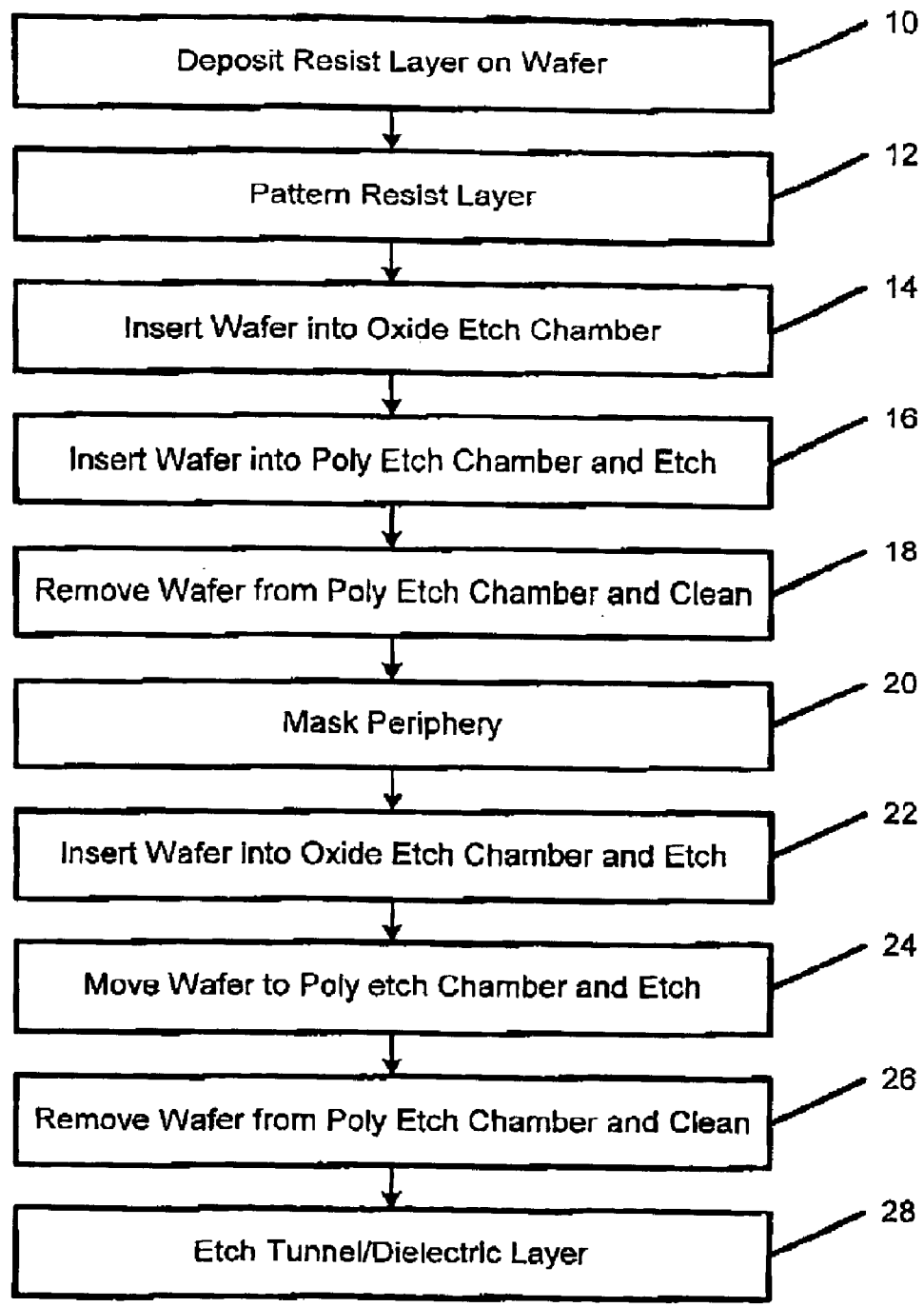
FIG. 1 is a flow diagram illustrating a conventional process for etching a semiconductor wafer.

As used herein, the term "standard-K dielectric" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9.

As used herein, the term "mid-K dielectric material" refers to a dielectric material having a K in the range from about 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric" refers to a dielectric material having a K of about 20 or more. Such high-K dielectric materials include, for example, $HfO_2$, $ZrO_2$, $Ta_2O_5$ and others identified more fully below. In addition, all binary and ternary metal oxides and ferroelectric materials having a K higher than about 20 can be used.

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

TABLE 1

| Dielectric Material | Dielectric Constant (K) (Relative Permittivity) |
|---|---|
| silicon dioxide | 3.9 |
| silicon nitride | 6–9 |
| silicon oxynitride | 4–8 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cesium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |

TABLE 1-continued

| Dielectric Material | Dielectric Constant (K) (Relative Permittivity) |
|---|---|
| tungsten oxide, $WO_3$ | 42 |
| yttrium oxide, $Y_2O_3$ | 20 |
| BST ($Ba_{1-x}Sr_xTiO_3$) | ~20—200 |
| barium strontium oxide ($Ba_{1-x}Sr_xO_3$) | ~20—200 |
| PST ($PbSc_xTa_{1-x}O_3$) | ~3000 |
| PZN ($PbZn_xNb_{1-x}O_3$) | ~7000 |
| PZT ($PbZr_xTi_{1-x}O_3$) | ~150—600 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Additionally, it should be noted that in both the text and claims, range and ratio limits may be combined.

Semiconductor Devices

The process of the present invention is described herein below in terms of a common semiconductor memory gate formed on a silicon substrate. It should be noted however, that the process of the present invention can be applied to any semiconductor device where it is necessary to selectively etch a dielectric layer. In particular, the process of the present invention is well suited for applications where it is necessary to selectively etch a mid-K or high-K dielectric layer.

As shown in FIG. 4, a memory gate 100 includes a layer stack 120 having a plurality of layers formed on a silicon substrate 102. The layers 120 include a tunnel layer 106 formed from a high-K dielectric material overlying on the silicon substrate 102, a first polysilicon layer 108 overlying the tunnel layer 106, and an oxide-nitride-oxide (ONO) layer 110 overlying the first polysilicon layer 108. The stack 120 also includes a second polysilicon layer 112 overlying the ONO layer 110, a silicide ($WSi_x$) layer 114 overlying the second polysilicon layer 112, a polysilicon cap layer 116 overlying the silicide layer 114, and a silicon oxynitride (SiON) layer 118 overlying the polysilicon cap layer 116. The silicon oxynitride layer 118 serves as an antireflective coating (ARC) layer, and hence may be used for many reduced-size critical dimension semiconductor devices. Both the polysilicon cap layer 116 and the silicon oxynitride layer 118 are deposited using conventional chemical vapor deposition (CVD) or plasma enhanced chemical vapor deposition (PECVD) techniques. The polysilicon cap layer 116 typically includes undoped polysilicon and has a thickness of about 500 Angstroms. The silicon oxynitride layer 118 includes silicon oxynitride (e.g., $SiO_x$, $N_y$, wherein x and y represent the atomic percentage of oxygen and nitrogen, respectively) and has a thickness of about 400 Angstroms.

As shown in FIG. 4, the layer stack 120 is configured for submicron memory gates, and has a height of between about 3,500 Angstroms to about 5,000 Angstroms. The tunnel layer 106 is about 50 Angstroms thick, and is thermally grown on substrate 102. The polysilicon layer 108 is a doped polysilicon layer formed on the tunnel layer 106 using conventional CVD or PECVD techniques to a thickness of about 900 to about 1,100 Angstroms, and is used in the memory gate as the floating polysilicon gate. The interpoly dielectric layer (ONO) 110 is then formed overlying the polysilicon layer 108 using conventional deposition techniques to a thickness of about 150 to 200 Angstroms total. As recognized in the art, the ONO layer 110 may be formed by a three-stage process including forming a first film of silicon dioxide on the polysilicon layer 108, depositing a film of silicon nitride on the silicon dioxide, and then depositing a second film of silicon dioxide on the silicon nitride film.

The polysilicon layer 112 is then deposited on the ONO layer 110 to a thickness of about 1,200 Angstroms. The silicide layer 114 is then formed using conventional silicide forming techniques to a thickness of about 1,100 to 1,700 Angstroms. The poly cap layer 116 is then formed to a thickness of about 500 Angstroms.

The silicon oxynitride layer 118 is then deposited overlying the poly cap layer 116. Although the preferred embodiment uses silicon oxynitride as an antireflective coating layer 118, alternative cap layer materials may be used that include a controllable atomic percentage of nitrogen, for example, silicon oxime. In another embodiment, layer 118 need not be present.

As discussed above, layers 108 to 118 are selectively etched in order to form the memory gate structure disclosed in FIG. 4 using, for example, a single-chamber etching process. An example of such a process is disclosed in U.S. Pat. No. 6,159,860, which is hereby incorporated herein in its entirety.

Although the present invention will be described in relation to the above-mentioned memory gate structure, the present invention is applicable to a wide range of semiconductor devices. As noted above, the present invention is applicable to any semiconductor device in which selective etching of a dielectric layer (in particular a high-K dielectric layer) is required. For example, the pre-treat (or pre-treatment) and etch steps of the present invention can be utilized in semiconductor devices in which photolithography is used to form one or more features/layers therein.

In-Situ Pre-Treat and Etch Process

As discussed above, the present invention involves the in-situ plasma pre-treatment and etch of a tunnel layer formed from a dielectric material (in particular a high-K dielectric material). As noted above, the in-situ plasma pre-treatment and etch can be utilized in the formation of any semiconductor device in which a selective etch of a dielectric layer is required. The in-situ plasma pre-treatment and etch process of the present invention is advantageous in that it eliminates the need to relocate or otherwise move a semiconductor device during manufacture between different tools.

The pre-treatment step and the plasma etch step of the present invention are conducted in a suitable plasma etching tool. Such tools are known to those skilled in the art and a discussion hereof is omitted.

The pre-treating step of the present invention involves utilizing a previously patterned mask to expose selective portions of a dielectric layer to any one or more types of plasma including, but not limited to, $O_2$, $N_2$, $N_2O$, NO, HBr, He, or fluorine chemistries suitable for use on high-K dielectric materials (e.g., $F_2$, $SF_6$ plus $O_2$, $CH_3F$ plus $O_2$). In another embodiment, a carrier gas and/or stabilizer gas such as Ar can be utilized in addition to the above pre-treatment plasma forming gases.

The gas or gases used in the present invention to produce the pre-treatment plasma are, in one embodiment, each supplied at a rate between about 25 and about 300 sccm, or at a rate of between about 50 and about 250 sccm, or even at a rate of between about 100 and about 200 sccm. The Ar gas, if desired, is in one embodiment supplied at a rate of about 200 sccm or less, or about 100 sccm or less, or at a rate of about 50 sccm or less, or even not at all (i.e., 0 sccm).

In another embodiment, the gas or gases used in the present invention to produce the pretreatment plasma are, in one embodiment, each supplied at a rate between about 20 and about 60 sccm, or at a rate of between about 30 and about 50 sccm, or even at a rate of between about 35 and about 45 sccm.

In another embodiment, the gas or gases used in the present invention to produce the pre-treatment plasma are, in one embodiment, each supplied at a rate between about 5 and about 30 sccm, or at a rate of between about 7 and about 20 sccm, or even at a rate of between about 10 and about 15 sccm.

In yet another embodiment, if more than one gas is utilized to form the pre-treatment plasma, each gas can be supplied at different rates dependent upon the dielectric material to be treated.

The pre-treatment process is conducted for about 10 to about 600 seconds, or from about 25 to about 400 seconds, or even from about 50 to about 200 seconds. The amount of time for the pre-treatment step of the present invention depends, in part, upon the thickness of the layer to be pre-treated. It should be noted that the pre-treatment step of the present invention is conducted for any suitable length of time, as noted above, so long as the dielectric layer is not etched.

Figure 5:
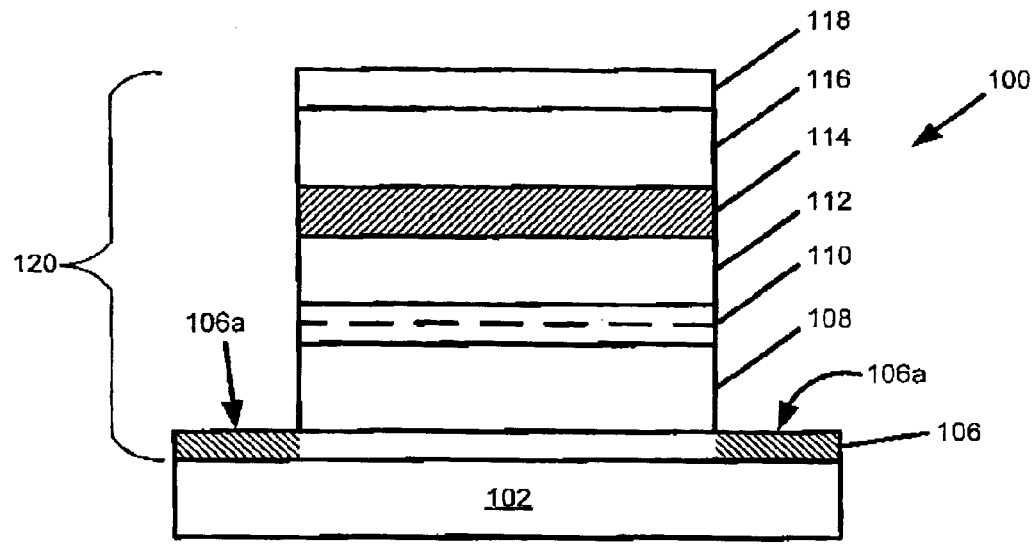
FIG. 5 is a schematic cross-sectional view of a exemplary semiconductor device (a memory gate) having a patterned stack layer that includes a polysilicon cap layer and a silicon oxynitride stop layer after pre-treatment and prior to plasma etch of the dielectric layer according to one embodiment of the present invention.
Figure 6:
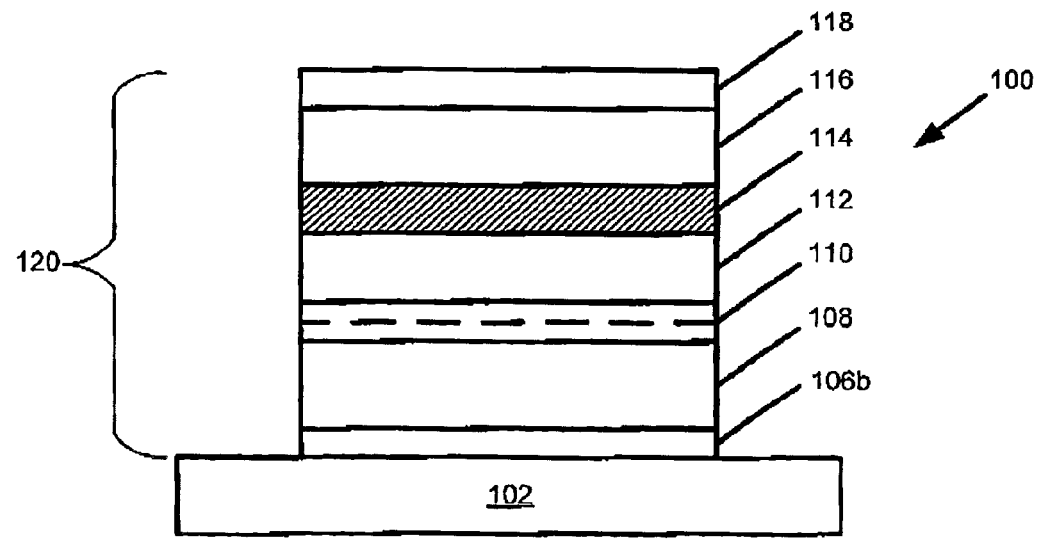
FIG. 6 is a schematic cross-sectional view of a exemplary semiconductor device (a memory gate) having a patterned stack layer that includes a polysilicon cap layer and a silicon oxynitride stop layer after both the pre-treatment and plasma etch of the dielectric layer according to one embodiment of the present invention.

As shown in FIG. 5, after the pre-treatment step the exposed portions of layer 106, the exposed portions thereof, as denoted by the hatched areas 106a, have been chemically altered so as to be more easily removed by the etch step described below.

After completion of the above-described pre-treatment step to increase the removal rate of the desired portions of layer 106, the semiconductor device is subjected to a plasma etch in the same plasma etching tool as used for the pre-treatment step.

The etch step seeks to remove the portions 106a of layer 106. This can be accomplished using a variety of etch chemistries. For example, portions 106a can be removed via etching with one or more types of plasma including, but not limited to, HBr, $F_2$, $SF_6$ plus $O_2$, $N_2$, and $CHF_3$ plus Ar. In another embodiment, if not already present, a carrier gas and/or stabilizer gas such as Ar, $O_2$, $N_2$, $N_2O$ and/or NO can be utilized in addition to the above pre-treatment plasma forming gases.

The gas or gases used in the present invention to etch portions 106a of layer 106 are, in one embodiment, each supplied at a rate between about 25 and about 300 sccm, or at a rate of between about 50 and about 250 sccm, or even at a rate of between about 100 and about 200 sccm. The carrier gas, if desired, is in one embodiment supplied at a rate of about 200 sccm or less, or about 100 sccm or less, or at a rate of about 50 sccm or less, or even not at all (i.e., 0 sccm).

In another embodiment, the gas or gases used in the present invention to etch portions 106a of layer 106 are, in one embodiment, each supplied at a rate between about 20 and about 60 sccm, or at a rate of between about 30 and about 50 sccm, or even at a rate of between about 35 and about 45 sccm.

In another embodiment, the gas or gases used in the present invention to etch portions 106a of layer 106 are, in one embodiment, each supplied at a rate between about 5 and about 30 sccm, or at a rate of between about 7 and about 20 sccm, or even at a rate of between about 10 and about 15 sccm.

In yet another embodiment, if more than one gas is utilized to form the pre-treatment plasma, each gas can be supplied at different rates dependent upon the dielectric material to be treated.

The etch step is conducted for about 10 to about 600 seconds, or from about 25 to about 400 seconds, or even from about 50 to about 200 seconds. The amount of time for the etch step of the present invention depends, in part, upon the thickness of the portions 106a of layer 106 to be removed. It should be noted that the etch step of the present invention is conducted for any suitable length of time, as noted above, so long as the desired portions of layer 106 are suitably removed.

Figure 3:
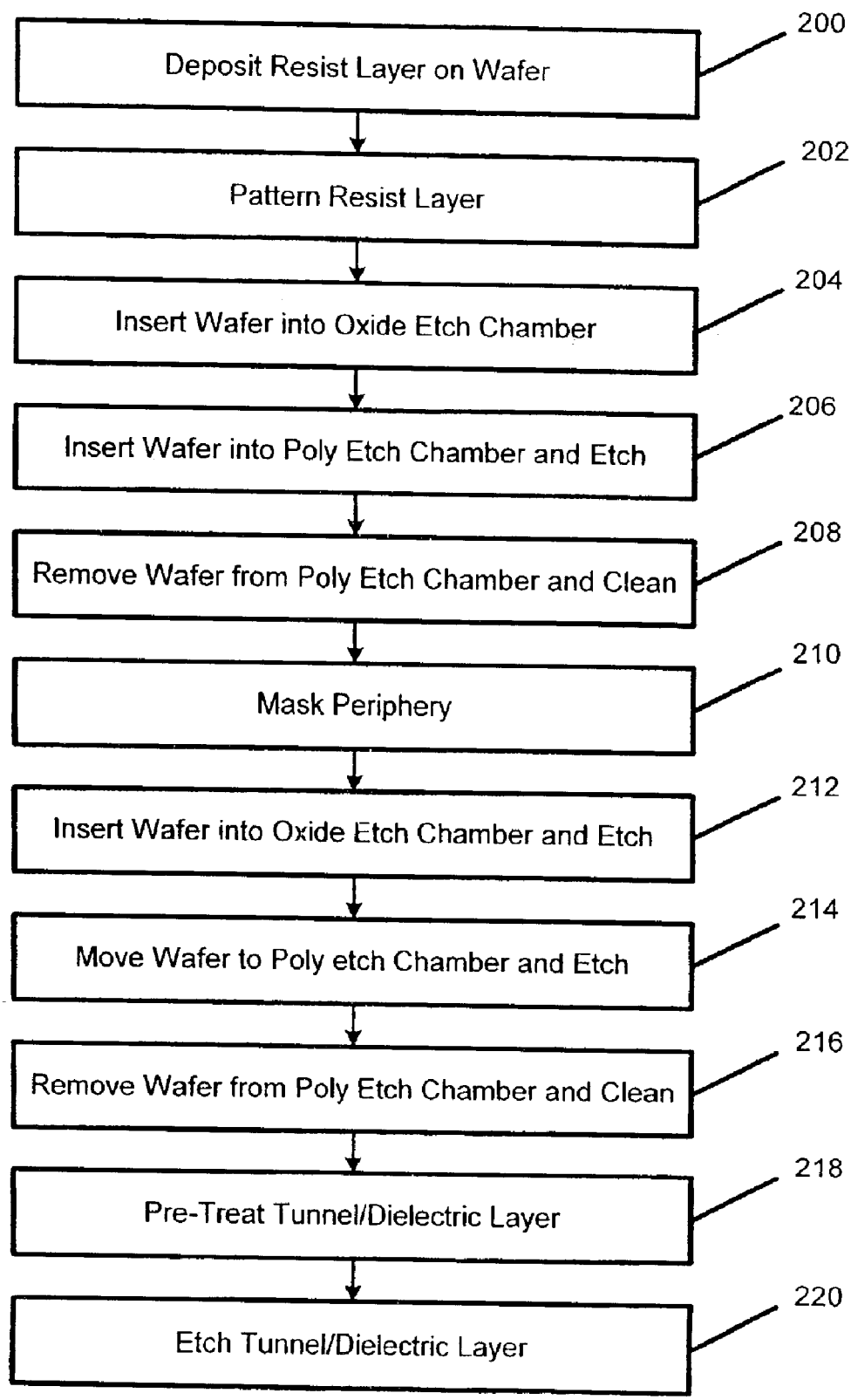
FIG. 3 is a flow diagram illustrating a process for producing a semiconductor device which includes pre-treating and etch steps according to the present invention.

The process of manufacturing the above-mentioned memory stack is shown in FIG. 3. Steps 200 to 216 are identical to steps 10 to 26 described above with regard to FIG. 1. The present invention differs from that disclosed in FIG. 1 in that steps 218 is the above-described pre-treatment step which results in the chemical alteration of any exposed portion of dielectric material and step 220 is the above-described etch step. As can be seen from FIG. 3, step 218 (the pre-treat step) is followed by step 220 (the etch step) using any of the above-described pre-treat/etch chemistries. After the completion of step 220, the portions 106a of dielectric layer 106 have been removed to yield dielectric layer 106b. It should be noted that after the completion of steps 218 and 220, the resulting semiconductor device can be further processed as is known in the art.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A method for pre-treating and etching a dielectric layer in a semiconductor device comprising the steps of:
   (A) pre-treating one or more exposed portions of a dielectric layer with a plasma in a plasma etching tool to increase removal rate of the one or more exposed portions upon etching; and
   (B) removing the one or more exposed portions of the dielectric layer in the same plasma etching tool of step (A) via plasma etching,
   wherein the plasma used to pre-treat the one or more exposed portions of the dielectric layer is selected from a plasma generated by $O_2$, $N_2$, $N_2O$, NO, HBr, He, $F_2$, $SF_6$ plus $CH_3F$ plus $O_2$, or mixtures of two or more thereof.

2. The method of claim 1, wherein the dielectric material is a standard-K dielectric material.

3. The method of claim 1, wherein the dielectric material is a mid-K dielectric material.

4. The method of claim 1, wherein the dielectric material is a high-K dielectric material.

5. The method of claim 4, wherein the high-K dielectric material comprises at least one of hafnium oxide, zirconium oxide, tantalum oxide, titanium dioxide, cesium oxide, lanthanum oxide, tungsten oxide, yttrium oxide, bismuth silicon oxide ($Bi_4Si_2O_{12}$), barium strontium oxide ($Ba_{1-x}Sr_xO_3$), BST ($Ba_{1-x}Sr_xTiO_3$), PZN ($PbZn_xNb_{1-x}O_3$), PZT ($PbZr_xTi_{1-x}O_3$) and PST ($PbSe_xTa_{1-x}O_3$).

6. The method of claim 1, wherein one or more carrier gases are utilized in the plasma pre-treat step.

7. The method of claim 1, wherein the plasma used to etch the one or more exposed portions of the dielectric layer is selected from a plasma generated by HBr, $F_2$, $SF_6$ plus $O_2$, $N_2$, $CHF_3$ plus Ar, or mixtures of two or more thereof.

8. The method of claim 7, wherein one or more carrier gases are utilized in the plasma etch step.

9. A method for pre-treating and etching a dielectric layer in a semiconductor device comprising the steps of:
   (A) pre-treating one or more exposed portions of a high-K dielectric layer with a plasma generated by one or more gases selected from $O_2$, $N_2$, $N_2O$, NO, HBr, He, $F_2$, $SF_6$ plus $O_2$, $CH_3F$ plus $O_2$, or mixtures of two or more thereof, in a plasma etching tool to increase removal rate of the one or more exposed portions upon etching; and
   (B) removing the one or more exposed portions of the dielectric layer in the same plasma etching tool of step (A) via plasma etching with a plasma generated by one or more gases selected from HBr, $F_2$, $SF_6$ plus $O_2$, $N_2$, $CHF_3$ plus Ar, or mixtures of two or more thereof.

10. The method of claim 9, wherein the high-K dielectric material comprises at least one of hafnium oxide, zirconium oxide, tantalum oxide, titanium dioxide, cesium oxide, lanthanum oxide, tungsten oxide, yttrium oxide, bismuth silicon oxide ($Bi_4Si_2O_{12}$), barium strontium oxide ($Ba_{1-x}Sr_xO_3$), BST ($Ba_{1-x}Sr_xTiO_3$), PZN ($PbZn_xNb_{1-x}O_3$), PZT ($PbZr_xTi_{1-x}O_3$) and PST ($PbSe_xTa_{1-x}O_3$).

11. The method of claim 9, wherein one or more carrier gases are utilized in the plasma pre-treat step and/or in the plasma etch step.

12. The method of claim 9, wherein one or more gases used in the pre-treat step are each independently supplied at a rate of between about 25 and about 300 sccm.

13. The method of claim 9, wherein one or more gases used in the pre-treat step are each independently supplied at a rate of between about 5 and about 30 sccm.

14. The method of claim 9, wherein one or more gases used in the etch step are each independently supplied at a rate of between about 25 and about 300 sccm.

15. The method of claim 9, wherein one or more gases used in the etch step are each independently supplied at a rate of between about 5 and about 30 sccm.

16. A method for pre-treating and etching a dielectric layer in a semiconductor device comprising the steps of:
   (A) pre-treating one or more exposed portions of a dielectric layer with a plasma in a plasma etching tool to increase removal rate of the one or more exposed portions upon etching; and
   (B) removing the one or more exposed portions of the dielectric layer in the same plasma etching tool of step (A) via plasma etching, wherein the dielectric material is a mid-K dielectric material or a high-K dielectric material.

17. The method of claim 16, wherein the plasma used to pre-treat the one or more exposed portions of the dielectric layer is selected from a plasma generated by $O_2$, $N_2$, $N_2O$, NO, HBr, He, $F_2$, $SF_6$ plus $O_2$, $CH_3F$ plus $O_2$, or mixtures of two or more thereof.

18. The method of claim 17, wherein one or more carrier gases are utilized in the plasma pre-treat step.

19. The method of claim 16, wherein the plasma used to etch the one or more exposed portions of the dielectric layer is selected from a plasma generated by HBr, $F_2$, $SF_6$ plus $O_2$, $N_2$, $CHF_3$ plus Ar, or mixtures of two or more thereof.

20. The method of claim 19, wherein one or more carrier gases are utilized in the plasma etch step.

* * * * *

UNITED STATES PATENT AND TRADEMARK OFFICE
CERTIFICATE OF CORRECTION

PATENT NO. : 6,905,971 B1
DATED : June 14, 2005
INVENTOR(S) : Tabery et al.

It is certified that error appears in the above-identified patent and that said Letters Patent is hereby corrected as shown below:

Column 1,
Line 30, replace "substate" with -- substrate --.
Line 33, replace "firm" with -- from --.

Column 8,
Line 2, replace "$SF_6$ plus $CH_3F$" with -- $SF_6$ plus $O_2$, $CH_3F$ --.

Signed and Sealed this

Thirtieth Day of August, 2005

JON W. DUDAS
*Director of the United States Patent and Trademark Office*